United States Patent
Sonego et al.

[11] Patent Number: 6,156,637
[45] Date of Patent: Dec. 5, 2000

[54] METHOD OF PLANARIZING A SEMICONDUCTOR DEVICE BY DEPOSITING A DIELECTRIC PLY STRUCTURE

[75] Inventors: Patrizia Sonego, Milan; Elio Colabella, Benofro; Maurizio Bacchetta, Milan; Luca Pividori, Turin, all of Italy

[73] Assignee: STMicroelectronics S.r.l., Agrate Brianza, Italy

[21] Appl. No.: 08/997,403

[22] Filed: Dec. 23, 1997

[30] Foreign Application Priority Data

Dec. 24, 1996 [EP] European Pat. Off. ............ 96830644

[51] Int. Cl.$^7$ .................................................. H01L 21/4763
[52] U.S. Cl. ........................ 438/624; 438/626; 438/760; 438/761
[58] Field of Search ..................... 438/623, 624, 438/626, 631–632, 697–699, 760, 761, 780, 781

[56] References Cited

U.S. PATENT DOCUMENTS

| | | | |
|---|---|---|---|
| 5,139,967 | 8/1992 | Sandhu et al. | 437/173 |
| 5,390,210 | 2/1995 | Fouquet et al. | 372/92 |
| 5,484,741 | 1/1996 | Bergemont | 437/43 |
| 5,589,412 | 12/1996 | Iranmanesh et al. | 437/73 |
| 5,656,556 | 8/1997 | Yang | 438/646 |
| 5,759,869 | 6/1998 | Chen et al. | 437/195 |
| 5,780,364 | 7/1998 | Thakur | 438/775 |
| 5,783,471 | 7/1998 | Chu | 438/257 |
| 5,808,947 | 9/1998 | McClure | 365/201 |
| 5,811,335 | 9/1998 | Santangelo et al. | 438/268 |
| 5,869,388 | 2/1999 | Chan et al. | 438/476 |
| 5,949,088 | 9/1999 | Morgan | 257/5 |
| 5,963,791 | 10/1999 | Brown et al. | 438/105 |

FOREIGN PATENT DOCUMENTS

| | | |
|---|---|---|
| 0 232 748 A1 | 8/1987 | European Pat. Off. . |
| 0 441 653 A2 | 8/1991 | European Pat. Off. . |
| 0 677 869 A1 | 10/1995 | European Pat. Off. . |
| WO 90/10307 | 9/1990 | WIPO . |

OTHER PUBLICATIONS

Stanley Wolf and Richard N. Tauber, Siliocn Processing the the VLSI Era vol. 1: Process Technology, Lattice Press, pp. 56–57, 539–541, 1986.

Spindler et al., "In Situ Planarization Of Intermetal Dielectrics: Process Steps. Degree Of Planarization And File Properties." *Thin Solid Films*, vol. 175, No. 1, Aug. 1989, pp. 67–72.

*Primary Examiner*—Matthew Smith
*Assistant Examiner*—Robert A. Hallinger
*Attorney, Agent, or Firm*—Theodore E. Galanthay; Robert Iannucci; Seed IP Law Group PLLC

[57] ABSTRACT

A method of depositing a dielectric ply structure to optimize the planarity of electronic devices that include a plurality of active elements having gate regions laid across the substrate as discrete parallel lines, such as the bit lines of memory cells. In accordance with the principles of the present invention, the plurality of bit lines may be isolated from one another by the dielectric ply structure to provide a planar architecture onto which an optional conductive layer may be deposited. The resulting planarization avoids the typical shortcomings of the prior art, such as the lack of electrical continuity in the word lines or their excessively high electrical resistance from slenderized portions in the conductive sections due to poor planarity of the surfaces upon which the conductive layer is deposited.

29 Claims, 5 Drawing Sheets

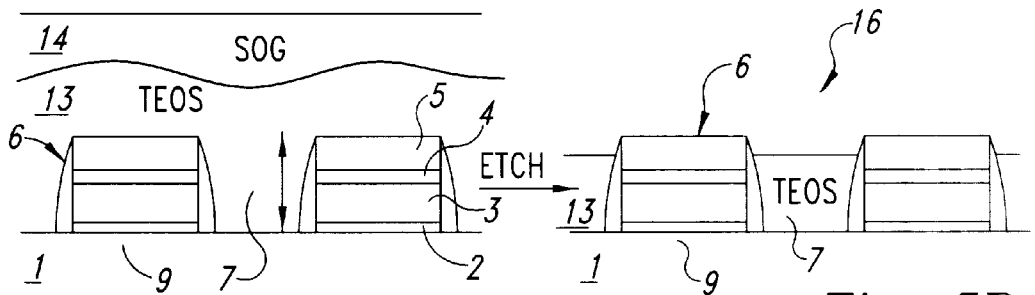
Fig. 5A (Prior Art)   Fig. 5B (Prior Art)
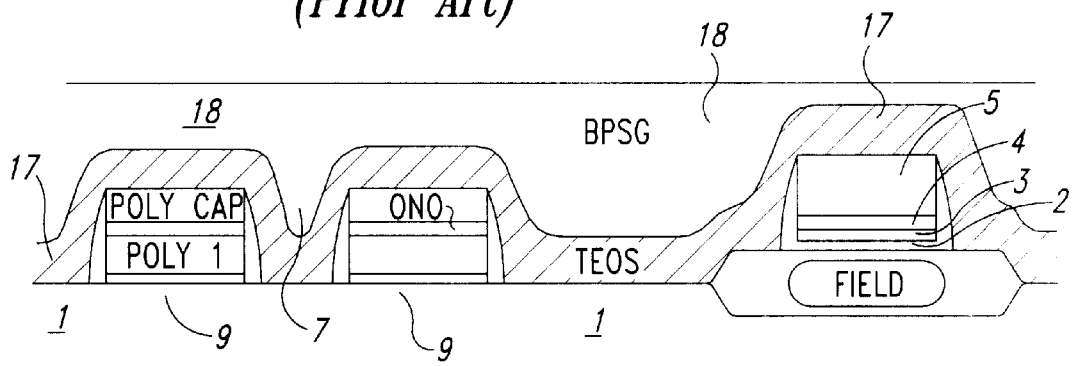
Fig. 6A
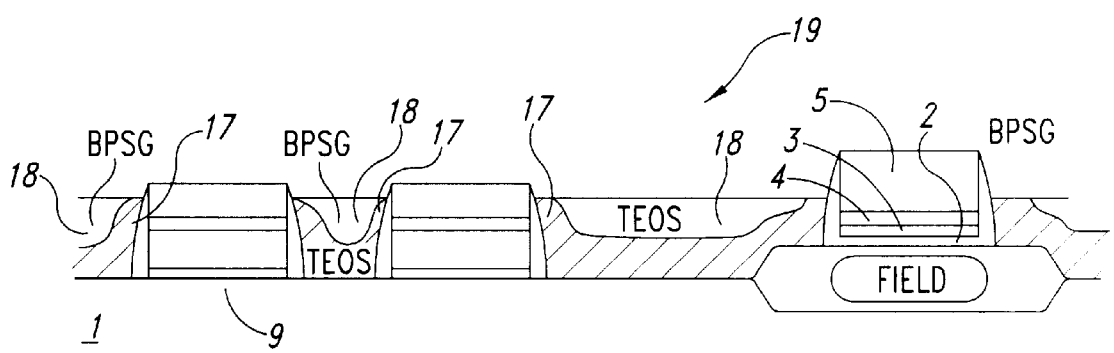
Fig. 6B

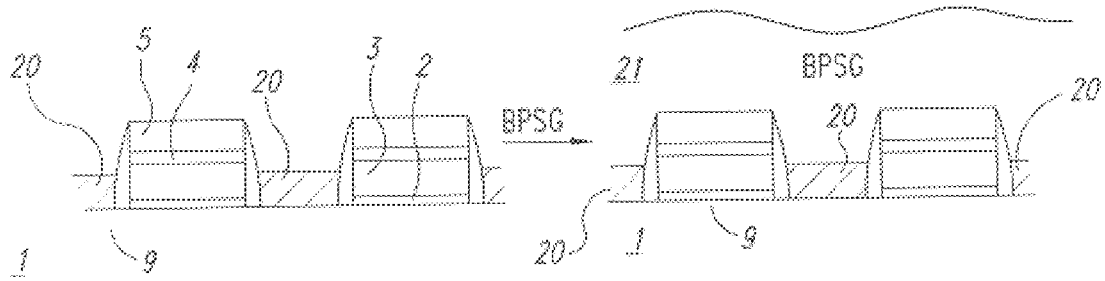
*Fig. 7A*   *Fig. 7B*
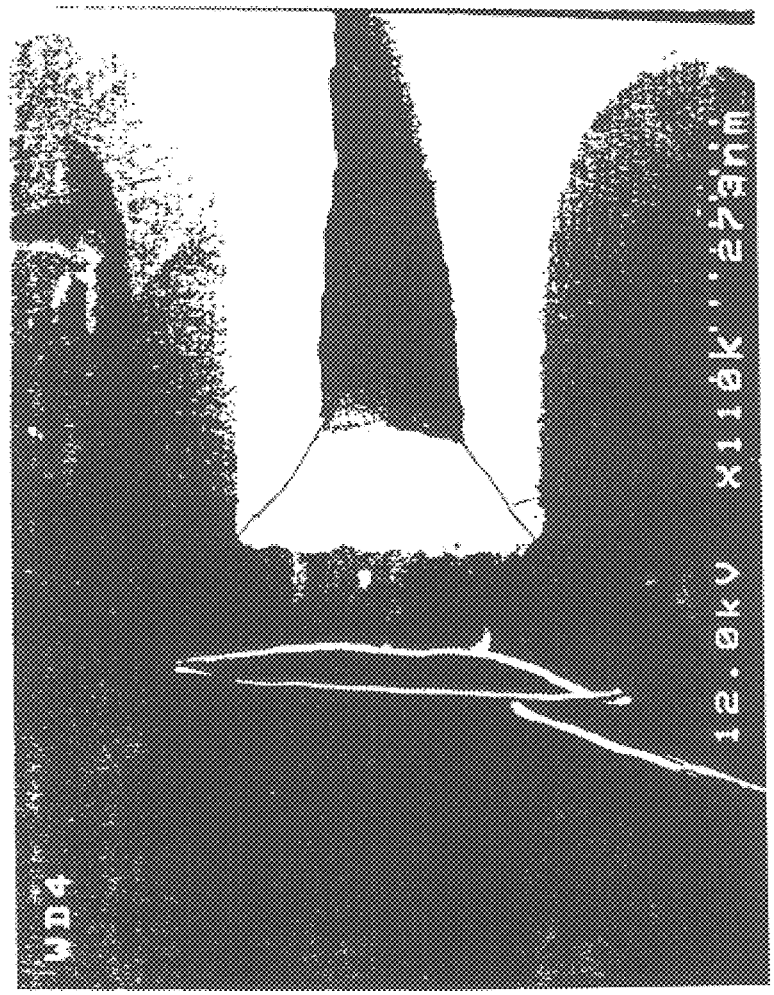
*Fig. 8*
(Prior Art)

METHOD OF PLANARIZING A SEMICONDUCTOR DEVICE BY DEPOSITING A DIELECTRIC PLY STRUCTURE

TECHNICAL FIELD

The present invention relates to a method of depositing a multiple dielectric ply structure in order to improve the planarity of electronic devices integrated on a semiconductor substrate.

BACKGROUND OF THE INVENTION

The fabrication of integrated electronic devices on semiconductor substrates usually requires that circuit topographies, which have been transferred by conventional photolithographic and dry or wet etching techniques, be checked for the occurrence of critical architectures that might impair reliable operation of a formed component. In particular, this test is necessary where a conductive layer is deposited onto a surface less than truly planar, that is, one showing local discontinuities or depressions. In fact, in some cases the conductive layer may have such a slender cross-section due to its poor adhesion on the deposited underlayer as to develop mechanical ruptures resulting in loss of electrical continuity. Accordingly, an integrated electronic device having a plurality of active elements with gate regions extending across the substrate as discrete parallel lines, for example, in the form of floating gate lines, typically requires reduction to a planar architecture prior to receiving a conductive overlayer.

Upon reviewing a vertical cross-section of the above-mentioned semiconductor substrate using an electronic microscope, as shown in FIG. 4, a typical square-wave profile can be observed. For the reasons just given, the square-wave profile is unsuitable to receive a deposition of conductive overlayer.

To avoid such problems, deposition of a conductive layer must be preceded by a planarity optimization step to provide a less discontinuous cross-sectional profile of the semiconductor substrate.

By way of example, consider a topography of the matrix type defined by a plurality of floating gates orthogonally intersected by a plurality of strips of a conductive material. That is, a structure typical of semiconductor storage circuits. In this specific application, the plurality of conductive (polysilicon doped+ONO) parallel lines including the floating gates will be referred to as the "bit lines," and the plurality of conductive (polysilicon doped+$WSi_2$) strips will be referred to as the "word lines."

In connection with the aforementioned example, a number of problems arise if a planarization step is not carried out prior to forming the plurality of word lines that orthogonally intersect the bit lines.

One problem results from the inherent nature of the conductive layers which, once deposited, tend to distribute themselves non-uniformly across the semiconductor substrates, thereby developing discontinuous profiles where substantially thick areas alternate with thinner areas. This problem is more pronounced when the semiconductor cross-sectional profile is more discontinuous. The deposition areas where the conductive layer is the least thick are the areas most susceptible to mechanical ruptures that destroy the electrical continuity of the layer.

Another problem arises when the plurality of regions in the semiconductor substrate, bounded by the bit lines, must be isolated electrically from the conductive layer deposited. Thermal growth of an isolation oxide in the spaces separating the bit lines may become necessary, which farther diminishes the vertical cross-section of the conductive layer, thereby increasing the resistance associated with the word lines. The word lines are formed from the deposited conductive layer by conventional photolithographic processes and either wet or dry etching operations.

FIG. 8 highlights another problem that is typically associated with devices having a deposited conductive layer. FIG. 8 is a photograph taken by an electronic microscope showing schematically a vertical cross-section of a plurality of bit lines integrated on a semiconductor substrate isolated from one another by a deposition of dielectric oxide and capped with a conductive layer. The problem is illustrated by the dark region located at the bottom of the picture. The dark region represents slenderized areas of the conductive layer near a light region identifying an oxide layer that separates the bit line from the conductive layer. The slenderized areas may cause short circuits between the active regions of the semiconductor substrate located beneath the plurality of bit lines and the word lines.

One more problem is the photolithographic processes and either wet or dry etching operations that are used to form the word lines from the deposited conductive layer may deform the floating gates because of the reiterate flushing involved with thoroughly removing the conductive layer from the regions not masked with resist.

A known proposal for planarizing semiconductor substrates having a plurality of floating gates is disclosed in Patent Application No. VA/000117/IN entitled "Processo EPROM a tovaglia" ("A Tablecloth EPROM Process"), filed by S. Mazzoli, M. Melanotte, L. Masini, and M. Sali in 1989. The patent application proposes isolating the plurality of floating gates from one another by depositing a first dielectric layer of the TetraEthylOrthoSilicate (TEOS) type. The thickness of the TEOS growth layer 13 is quite substantial. FIGS. 5A and 5B show one example of a prior art approach. On top of a substrate 1, a gate oxide 2 is formed on top of which is formed a layer of first poly 3, insulator 4, second poly 5 having a space 7 between. adjacent bit lines, as is well-known in the art. This provides a gate channel region 9 of a bit line 6. A sidewall oxide spacer is then formed, again, as well-known in the art. A TEOS layer 13 is formed, for example, three times as great as the step between the substrate 1 and the upper portion of the individual bit lines.

A second dielectric layer of the Spin-On Glass (SOG) 14 type is then deposited onto the first dielectric layer 13 in order to planarize the surface of the semiconductor substrate. Thereafter, the planarized surface is subjected to selective etching with respect to the polysilicon of the plurality of floating gates, thereby thoroughly removing the SOG dielectric layer and confining the TEOS layer to the gaps between the plurality of floating gates.

However, a serious drawback of this proposal is that the wet or dry etching steps used to remove the excess insulating dielectric are hardly repeatable and cause the planarity previously achieved through the deposition of the SOG type of dielectric layer to deteriorate.

In addition to the drawback mentioned above, the deposition of dielectric layers of the TEOS type are often accompanied by the formation of micro-voids or cracks within the grown material. These micro-voids or cracks may establish undesired contacts between contiguous deposited layers, as previously shown in FIG. 8.

The above observation is confirmed in the article "Planarized $SiO_2$ Interlayer Formed by Two Step $O_3$/TEOS APCVD and Low Temperature Annealing," by Koji Kishimoto, Mieko Suzuki, Takeshi Iirayama, Yasuo Ikeda, and Youichirou Numasawa of NEC Corporation, Jun. 9–10, 1992, page 150, line 10. The authors emphasize the impossibility of using TEOS-type dielectric layers of substantial thickness because of the occurrence of mechanical failures that can only be avoided by adopting more elaborate growth methods.

SUMMARY OF THE INVENTION

According to the principles of the present invention, a method is provided for depositing a dielectric ply structure, effective to planarize a semiconductor substrate laid with a plurality of spaced bit lines, so as to accommodate the optional deposition of an overlying conductive layer and overcome the aforementioned limitations and drawbacks besetting the prior art.

An embodiment of the present invention provides for using a dielectric ply structure comprising a first dielectric layer effective to isolate the plurality of bit lines from one another, and a second dielectric layer effective to planarize the semiconductor substrate surface by means of rapid thermal annealing treatments.

Another embodiment of the present invention provides for using a dielectric ply structure, characterized in that it comprises a second planarization dielectric layer of the Boron Phosphorus Silicate Glass (BPSG) type to completely cover the first isolating dielectric layer.

The method and dielectric structure of the present invention overcomes the limitations and drawbacks of the prior art that interfered with obtaining sufficient levels of semiconductor substrate planarity to allow the deposition of a conductive layer thereon.

The present invention relates to such devices comprising a plurality of active elements which have gate regions extending across the substrate as discrete parallel lines, e.g. as bit lines of memory cells, said lines being isolated from one another by a first dielectric layer which also fills the gaps therebetween.

The invention also concerns a dielectric ply structure for planarizing electronic devices integrated on a semiconductor substrate; such devices comprising a plurality of active elements which have gate regions extending across the substrate as discrete parallel lines, e.g. as bit lines of memory cells, said lines being isolated from one another by a first dielectric layer which also fills the gaps therebetween.

In particular, but not exclusively, a method of depositing a dielectric ply structure in order to improve the planarity of integrated electronic devices which include EPROM or $E^2$PROM memory cells. The invention also concerns a dielectric ply structure for planarizing electronic devices integrated on a semiconductor substrate.

The features and advantages of the inventive device will be apparent from the following description of an embodiment thereof, given by way of non-limitative example with reference to the accompanying drawings.

BRIEF DESCRIPTION OF THE DRAWINGS

FIGS. 5A and 5B show schematically, to an enlarged scale, a vertical cross-section through a semiconductor electronic device during a step of depositing a planarized dielectric layer, starting from a TEOS-SOG ply dielectric structure, according to the prior art.

FIGS. 6A and 6B show schematically, to an enlarged scale, a vertical cross-section through a semiconductor electronic device during a step of depositing a TEOS-BPSG ply dielectric structure, in accordance with the principles of this invention.

FIGS. 7A and 7B show schematically, to an enlarged scale, a vertical cross-section through a semiconductor electronic device during a step of depositing an oxide-BPSG dielectric structure, in accordance with a possible modification of the inventive deposition method.

FIG. 8 is derived from a photograph, taken at the electronic microscope, of a plurality of bit lines as integrated on a semiconductor substrate and isolated by an oxide layer from a deposition of a conductive layer thereon.

DETAILED DESCRIPTION OF THE INVENTION

Figure 1:
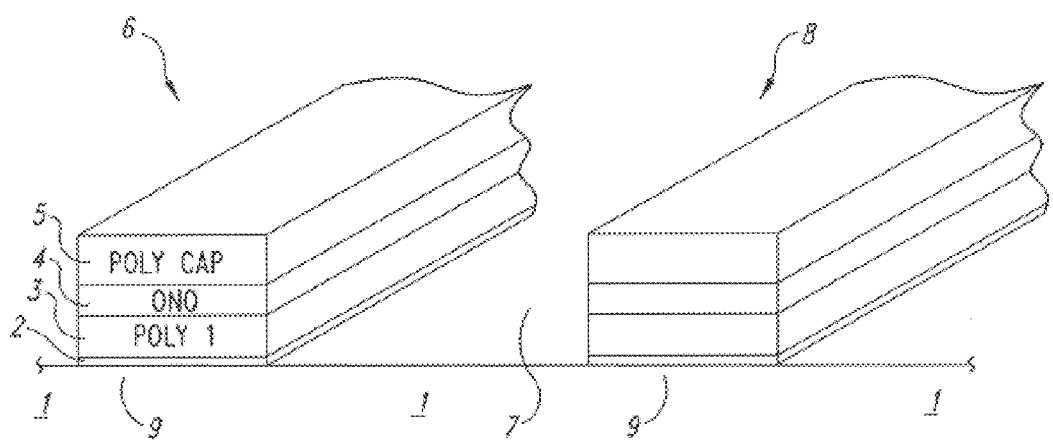
FIG. 1 perspective view, drawn to an enlarged scale, showing schematically an electronic device integrating a plurality of spaced bit lines on a semiconductor substrate prior to use of invention.

FIG. 1 shows a perspective view of a semiconductor substrate integrating a plurality of lines 6, such as bit lines, laid parallel to, and at a spacing from, one another (also referred to above as the plurality of floating gates). Each bit line 6 deposited onto the semiconductor substrate 1 in predetermined areas thereof, comprises: a first thin oxide layer 2 referred to as the tunnel or gate oxide; a second layer 3 of polysilicon, also referred to as the poly1; a third, isolating layer 4, typically of ONO; and a fourth layer 5 of polysilicon, also referred to as the poly cap. As can be seen, the difference in height between the layers 6 and the substrate 1 can be substantial. If the space 7 is quite small so the bit lines are close together, the prior art technique of applying a conductive polysilicon may result in open circuits or high resistance connections.

Figure 2:
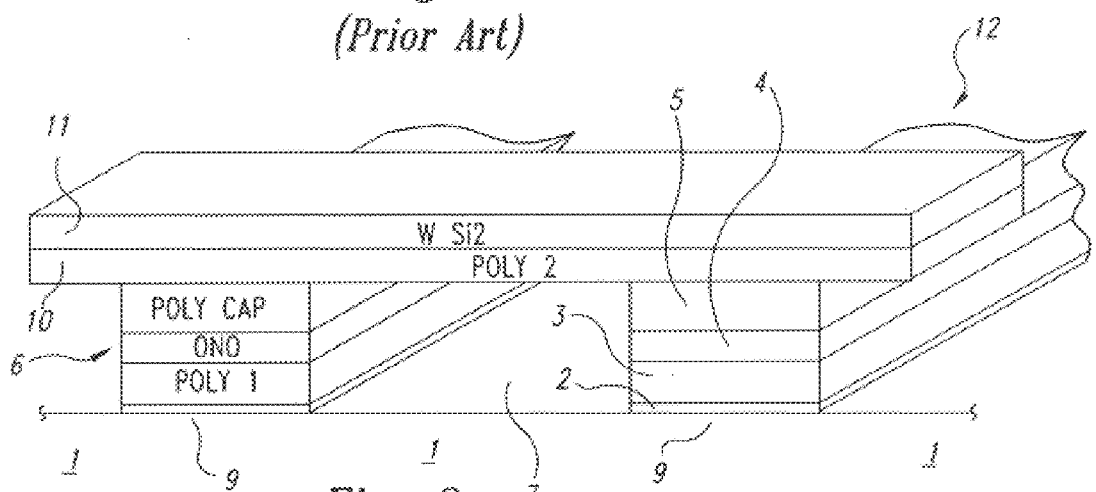
FIG. 2 is a perspective view, drawn to an enlarged scale, showing schematically an electronic vice integrating a plurality of spaced bit lines on a semiconductor substrate which are intersected at the top by a plurality of word lines to better illustrate the problem presented by the prior art.
Figure 3:
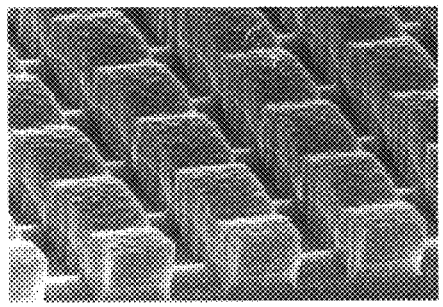
FIG. 3 is derived a photograph, taken at the electronic microscope, of a plurality of EPROM memory cells having a matrix-like topography resulting from intersecting bit and word lines.
Figure 4:
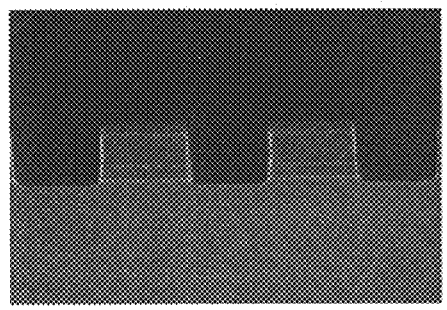
FIG. 4 is derived from a photograph, taken at the electronic microscope, of a square-wave profile associated with a semiconductor substrate that integrates a plurality of bit lines according to the prior art.

As shown in FIG. 2, the lines 6 may be of the type used in EPROM cells and it may be desirable to provide a lateral connection to some of the adjacent lines 6, in a horizontal top plane, if orthogonally intersected at the top by a plurality of parallel spaced conductive strips 12. The plurality of conductive strips 12 are customarily referred to as the word lines.

Notice that in FIGS. 6A and 6B, the bit lines are protected laterally by intentional leftovers of dielectric material called the "spacers." The spacers can be formed by depositing a layer of silicon nitride or TEOS over the substrate and bit lines followed by an isotropic etching step. However, the use of spacers is not a strict requirement to the implementation of this invention. Accordingly, the invention and the following description may also be applied to FIGS. 12A, 12B, and 12C where no spacers are present.

The method of depositing a dielectric ply structure according to embodiments of the present invention will now be described with specific reference to the problem of planarizing an architecture 8 wherein a plurality of bit lines 6 can be used to provide EPROM cells.

The deposition method proposed herein can ensure that the gaps 7 between the plurality of bit lines 6 are filled, thereby ensuring good surface planarity and a planarized architecture 19, as shown in FIG. 6B. A conductive layer free of mechanical failures or slenderized sections is deposited onto this architecture 19.

Referring to FIGS. 6A and 6B, the inventive method provides for the deposition of a first dielectric layer 17 grown under predetermined conditions that prevents the development of cracks or micro-voids. The thickness of the layer 17 is illustratively in the range of 500 Å to 3,000 Å. A thickness is selected that is high enough to isolate the plurality of bit lines 6 from one another and fill the gaps 7 therebetween.

Subsequently, as shown in FIG. 6A, a second dielectric layer 18 of the BPSG type is depicted to planarize the surface of the semiconductor substrate and fill the gaps 7 between bit lines 6. The thickness of the second layer 18 is illustratively in the range of 1000 Å to 6000 Å. The concentration of phosphorous and boron are each selected to provide reflow under a required thermal anneal. In one embodiment, it has a chemical composition with a low concentration of phosphorus and a high concentration of boron. The high boron concentration allows the melting temperature of the layer 18 to be kept low so that the deposited material can be subjected to annealing and softening thermal cycles at lower temperatures. In one embodiment, concentration of phosphorous is in the range of 2–5% and the concentration of boron is in the range of 3–5%. A preferred concentration for each is at about 4%. The results of experiments carried out by the inventor show that a boron and phosphorus concentration each being at 4% is specially suitable.

In order to optimize the planarity of the second dielectric layer 18 of the BPSG type, the deposition step is followed by a thermal reflowing operation of either rapid thermal annealing cycles or quick bakings in an oven. The thermal reflowing of the deposited material is performed under controlled temperature conditions within the range of 900° C. to 1000° C. and in the presence of a gaseous species such as oxygen, nitrogen or mixtures thereof.

A next step of the inventive deposition method involves a partial etching of the second planarized dielectric layer 18 by plasma techniques. As shown in FIG. 6B, etching is continued until each bit line 6 is partially exposed so as to confine the second planarized dielectric layer 18 to just the regions 7 between bit lines. A feature of the selection of material to fill the space 7 is that etching it is selective with respect to the polysilicon material. According to one embodiment, the selectivity is a prerequisite to ensure that the layers 2, 3, 4, and 5 making up the bit lines 6 are not etched away. However, in those embodiments where the thickness of the polysilicon layer 5 is substantial, selectivity would no longer be needed because planarity is improved by a partial removal of the layer 5. Thus in this alternative embodiment, the etching is not selective between the dielectric layer 18 and polysilicon layer 5.

According to one preferred embodiment, the selective etching is carried out using plasma etching in the presence of gas mixtures comprising carbon tetrafluoride ($CF_4$) and carbon trifluoride ($CHF_3$).

A technical feature for improving the planarity levels of the semiconductor substrate, as obtained with the deposition method of this invention, is to have the lines 6 formed with a selected thicknesses. In particular, it has been found experimentally that having a layer 5 of poly cap deposited over the ONO isolation layer 4 with a thickness of 2,000 Å to 4,000 Å, is a condition that affords superior levels of planarity.

The teaching provided by this invention allows surface planarization to be achieved, which in turn makes the deposition of a conductive layer over a previously non-planar integrated architecture possible. The conductive layer is free of mechanical ruptures in the deposited film or shrinkages in its cross-section, both of which would improve the reliability of the electronic device being formed.

In one embodiment, the non-planar features are conductive, so that the invention permits reliable interconnection of the conductive features.

Another embodiment of the proposed deposition method provides for additional process steps to take place in those structures where the planarized architecture 19 of the invention previously described is applied specifically to producing FLASH memory cells having a matrix-like topography. The additional process steps are appended consecutively to the process steps already described and affords optimum utilization of the surface planarization already achieved.

Figure 9:
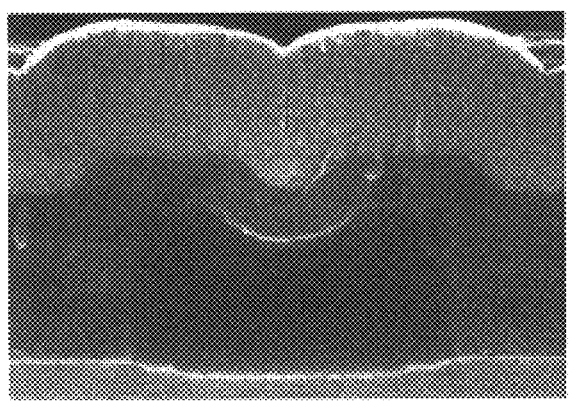
FIG. 9 is derived from a photograph, taken at the electronic microscope, of a conductive layer as deposited onto an architecture which has been planarized with a dielectric structure according to the invention and has its level of planarity diminished as a result of subsequent flushing with aqueous-acidic solutions.
Figure 10A:
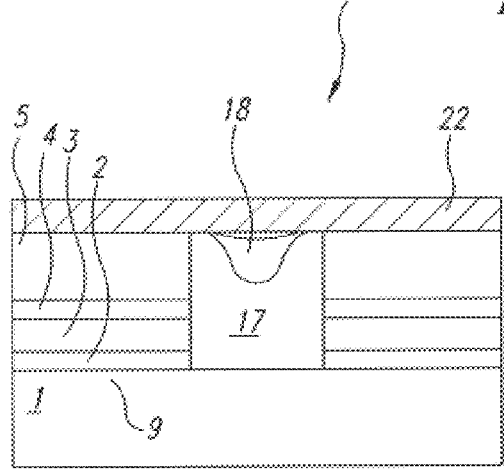
FIGS. 10A and 10B show schematically, to an enlarged scale, a vertical cross-section through a semiconductor electronic device as planarized with the method of this invention through an additional step of depositing a conductive layer comprised of multiple films.

Frequently, the standard non-volatile memory cell forming process includes subsequent photolithographic resist forming and dry-wet etching operations that involve repeated flushing with aqueous-acidic solutions prior to depositing the layers that will compose a word line 10. While necessary to remove the resist from protected areas, while the different layers are having being patterned and etched, the repeated flushing is harmful to planarity in that the layer under the resist may also be affected. The net result is that micro-voids may form that make the deposition of a conductive overlayer impracticable. FIG. 9 illustrates an instance where, subsequent to a flushing operation on the planarized architecture 19, a conductive layer has been deposited, as highlighted by the white trace visible in FIG. 9. It can be seen that the conductive layer penetrates the micro-voids formed in the surface. According to a further embodiment, problems of this kind are prevented by further steps. Once surface planarity has been achieved by the deposition method previously described, a third conductive layer 22 of polysilicon having a thickness varying illustratively between 300 nm and 500 nm is immediately deposited, as shown in FIG. 10A, to protect the planarized architecture 19.

After this step, the standard process flows employed to complete making non-volatile memory cells may continue without impairing the planarity of the architecture 19. Namely, a resist layer can be deposited and etching take place, without affecting the planarity of the structure. Thus, it becomes possible to deposit a resist layer to define the areas from which the protective polysilicon 22 and underlying poly cap layer 5 are to be removed. Thereafter, a dry-wet etching operation will remove said materials from the areas not masked by resist. Flushing with an aqueous-acidic solution will then be necessary to remove the resist from the protected areas.

Using the deposition method according to this embodiment of the invention, the planarizing dielectric layer 18 of BPSG can no longer be etched away because of the protection afforded by a protective layer 22 of polysilicon. The layer 22 is thus a sacrificial layer that protects the planarity of the structure but then is removed prior to the step in which the layers 10 and 11 are deposited.

Figure 10B:
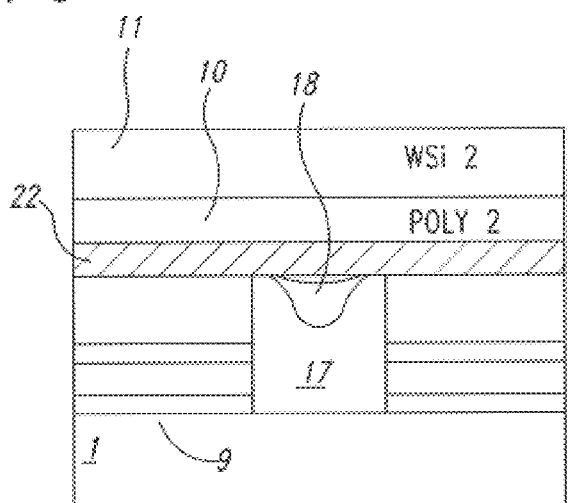

Thereafter, if a tablecloth topography including EPROM cells is to be formed from the planarized and protected architecture 23, the following steps should be carried out:

p-ISO and LUS-channel implanting;

depositing a fourth conductive layer 10 of polysilicon, referenced as poly2 in FIG. 10B;

depositing a fifth conductive layer 11 including silicide of tungsten; and photolithographing and selectively etching to define the word lines.

In this embodiment of the deposition method according to the invention, the first dielectric layer 17 isolating the non-planarized architecture 8 may be obtained, as shown in FIG. 7A, with an oxide layer 20 grown thermally on the overlying regions of the semiconductor substrate bounded by the bit lines 6. The oxide layer 17 may have a thickness in the range of 500 Å to 3000 Å. This modification illustrates a further embodiment of the principles on which this invention is based. In particular, the modification illustrates the possibility of achieving comparable levels of planarity using a dielectric layer 17 of some other type besides the TEOS type. In some embodiments, a TEOS material for layer 17 is preferred; in other embodiments, this layer may develop cracks or micro-voids, unless grown under definite conditions of pressure and temperature. Thus, it is preferred in some process flows to form the layer 17 using a grown oxide or deposited oxide or some other layer.

To summarize, the deposition method of the embodiments of the present invention allows the surface of semiconductor substrates to be planarized, and gaps 7 that may measure less than 0.6 μm in size and have substantial depths to be filled in a way previously impossible to achieve with the deposition of films or layers by the usual chemical vapor deposition (CVD) methods.

It should be further noted that the thermal treatments provided by the deposition method of the embodiments of the invention are consistent with the integration of electronic devices with CMOS technology, since the temperatures required to promote reflowing of the deposited layers are quite moderate.

Figure 11:
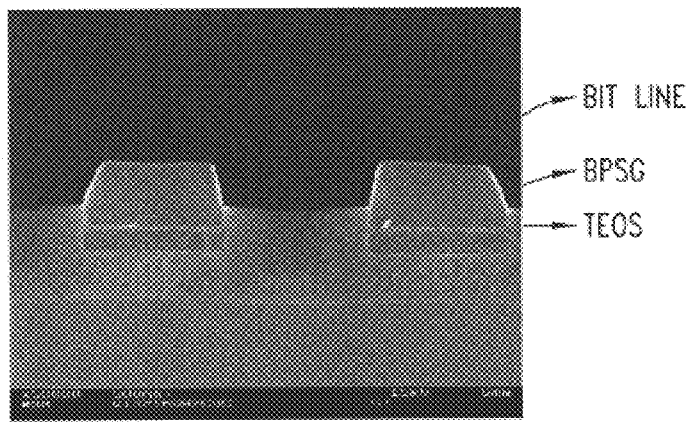
FIG. 11 derived from a photograph, taken at the electronic microscope, of a vertical gross-section through a semiconductor architecture as planarized by a dielectric ply structure according to the invention.

All of the above advantages afforded by the deposition method in accordance with the principles of the present invention can be recognized and ascertained by TEM and SEM analysis, as illustrated by FIG. 11, of semiconductor substrates having planarization dielectric ply structures grown using the method, and modifications thereof, previously described.

Figure 12A:
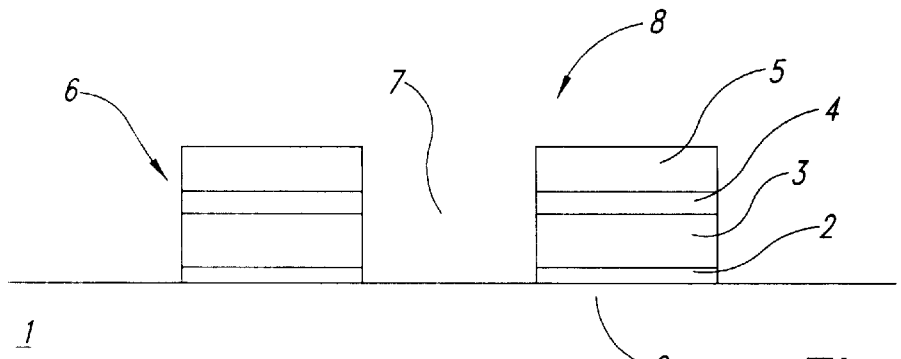
FIGS. 12A–12C show schematically, to an enlarged scale, a vertical cross-section through a semiconductor electronic device lacking the protection of spacer elements, during a step of depositing a TEOS-BPSG ply dielectric structure in accordance with the principles of this invention.
Figure 12B:
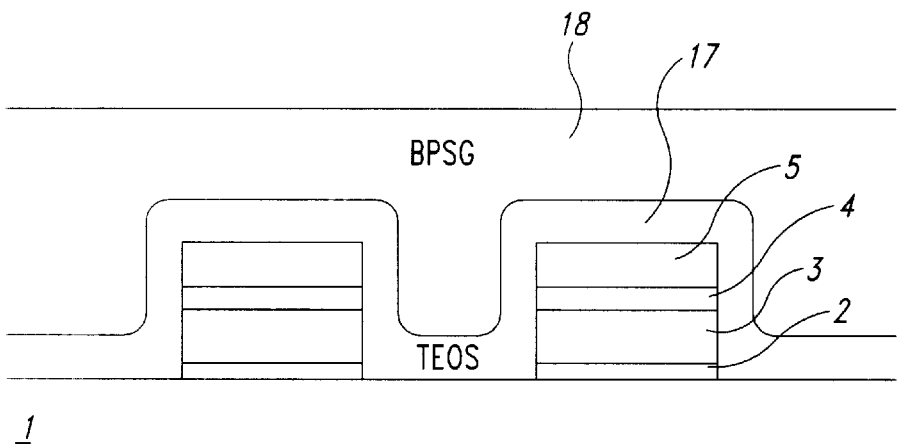
Figure 12C:
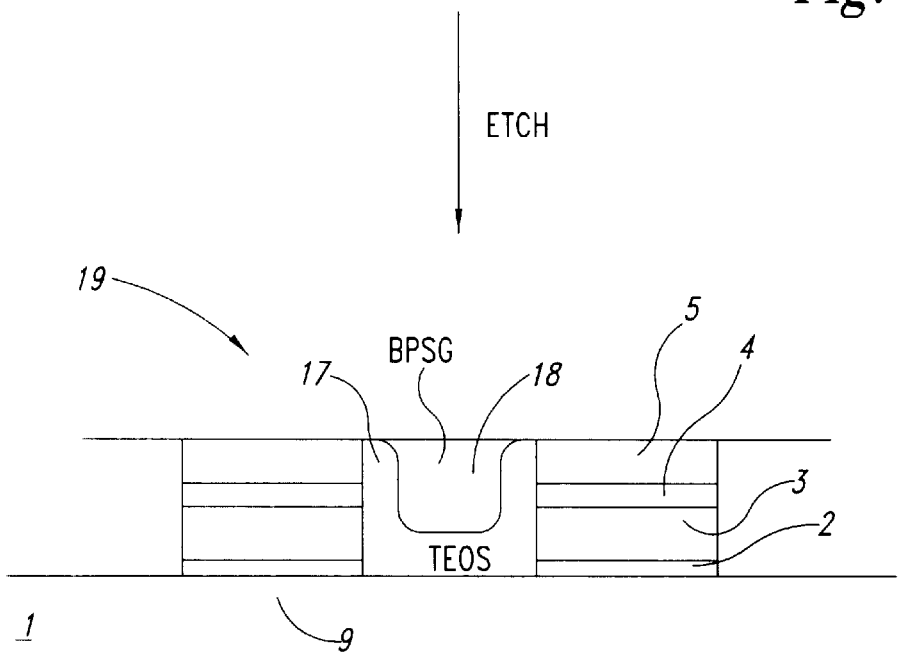

FIGS. 12A–12C illustrate a further embodiment of the invention. According to many process flows, a sidewall oxide 32 is formed as part of the process, techniques for forming such being well-known in the art. However, in some embodiments, such as shown in FIGS. 10A–B and 12A–C, the sidewall oxide 32 is no present. According to this embodiment, the TEOS is formed to fill the gap 7 and overlays the top of the conductor 6. The BPSG is then deposited and then reflowed using a rapid thermal anneal to fill the voids and planarize the surface, see FIG. 12B. Following this, the material is etched, FIG. 12C, to provide a planar surface of conductive strips with insulator having the same level and being planar with the top thereof.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of depositing a dielectric ply structure to improve the planarity of electronic devices integrated on a semiconductor substrate, which devices include a plurality of active elements having gate regions laid across the substrate as discrete parallel lines, said lines being isolated from one another by a first dielectric layer which also fills gaps therebetween and each having an upper conductive layer, the method comprising the following steps:

depositing a second dielectric layer to planarize the surface of the semiconductor substrate;

rapid thermal annealing to reflow the second dielectric layers;

dry etching the dielectric layers to an extent that exposes the conductive layers of the lines after the rapid thermal annealing step; and forming conductive interconnection lines on the exposed conductive layers of the lines, the interconnection lines being transverse to the lines.

2. The method of deposition according to claim 1 wherein said second dielectric layer is of the BPSG type.

3. The method of deposition according to claim 1 wherein said dry etching step includes a plasma etching step that partially removes the first and the second dielectric layers and confines said second dielectric layer to the gaps between said discrete parallel lines.

4. The method of deposition according to claim 3 wherein the plasma etching step carried out on the second planarized dielectric layer is followed by the deposition of a protective layer to fully cover said second planarizing dielectric layer before said interconnection lines are formed on the exposed lines.

5. The method of deposition according to claim 4 wherein said protective layer is a conductive layer.

6. The method of deposition according to claim 5 wherein said protective layer is a polysilicon layer.

7. The method of deposition according to claim 4 wherein the thickness of said protective layer is within the range of 300 nm to 500 nm.

8. The method of deposition according to claim 3 wherein said discrete parallel lines include a polysilicon outer layer and said plasma etching step is selective in that the dielectric layers are etched without etching the polysilicon outer layer.

9. The method of deposition according to claim 1 wherein said first dielectric layer is an oxide deposited by TEOS technique.

10. The method of deposition according to claim 1 wherein the thickness of said first dielectric layer is within the range of 500 Å to 3000 Å.

11. The method of deposition according to claim 1 wherein the thickness of said second dielectric layer is within the range of 1000 Å to 6000 Å.

12. The method of deposition according to claim 1 wherein said second dielectric layer includes 2–5% boron and 3–5% phosphorus.

13. The method of deposition according to claim 12, wherein said second dielectric layer has a boron and phosphorus concentration of 4% each.

14. The method of deposition according to claim 1 wherein said rapid thermal annealing is carried out at a temperature in the 900° C. to 1000° C. range.

15. The method of deposition according to claim 1 wherein said rapid thermal annealing is carried out under a stream of gas or gas mixtures.

16. The method of deposition according to claim 15 wherein said gas mixtures comprise oxygen or nitrogen.

17. A method of depositing a dielectric ply structure to improve the planarity of electronic devices integrated on a semiconductor substrate, which devices include a plurality of active elements having gate regions laid across the substrate as discrete parallel lines, said lines being isolated from one another by a first dielectric layer which also fills gaps therebetween and each having an upper conductive layer, the method comprising the following steps:

growing a first dielectric layer of oxide on substrate regions intervening between said lines;

depositing a second dielectric layer one the first dielectric layer; and rapid thermal annealing to reflow the second dielectric layer;

dry etching the dielectric layers to an extent that exposes the upper conductive layers of the lines after the rapid thermal annealing step; and forming conductive interconnection lines on the exposed upper conductive layers of the lines, the interconnection lines being transverse to the parallel lines.

18. The method of deposition according to claim 17 wherein said first dielectric layer of dielectric oxide is 500 Å thick.

19. A method of forming an electronic device integrated on a semiconductor substrate, the device including a plurality of active elements in the substrate and having gate regions extending from the substrate, the gate regions including art upper conductive layer, the method comprising:

forming a first dielectric layer to cover the active layers;

depositing a second dielectric layer over the first dielectric layer and over the gate regions;

reflowing the second dielectric layer by using rapid thermal annealing; and dry etching at least a portion of the second dielectric layer to planarize the first and second dielectric layers, the dry etching step exposing the upper conductive layers of the gate regions; and forming conductive interconnection lines on the exposed upper conductive layers of the gate regions.

20. The planarization method of claim 19 wherein the step of forming the first dielectric layer comprises depositing a dielectric layer having a thickness between 500 Å and 3000 Å.

21. The planarization method of claim 20 wherein the step of forming a first dielectric layer comprises growing a first dielectric layer having a thickness of in the range of 500 Å and 1000 Å.

22. The planarization method of claim 19 wherein the step of depositing the second dielectric layer comprises depositing a layer of BPSG.

23. The planarization method of claim 22 wherein the step of depositing a layer of BPSG comprises depositing a layer of BPSG having a phosphorous concentration of 4%.

24. The planarization method of claim 22 wherein the step of depositing a layer of BPSG comprises depositing a layer of BPSG having a thickness between 1000 Å and 6000 Å.

25. The planarization method of claim 19 wherein the step of reflowing the second dielectric layer is performed within the temperature range of 900° C. and 1000° C.

26. The planarization method of claim 25 wherein the step of reflowing the second dielectric layer is performed in the presence of a gaseous species of oxygen, nitrogen, or mixtures thereof.

27. The planarization method of claim 19 wherein the step of dry etching at least a portion of the second dielectric layer continues until the first and second dielectric layers are confined entirely between the gate regions.

28. The planarization method of claim 19, further comprising depositing a conductive layer over remaining first and second dielectric layers to protect the remaining first and second dielectric layers.

29. The planarization method of claim 28 wherein the step of depositing a conductive layer comprises depositing a conductive layer having a thickness between 300 nm and 500 nm.

* * * * *